United States Patent
Hoyt

(10) Patent No.: US 9,473,028 B1
(45) Date of Patent: Oct. 18, 2016

(54) SYSTEMS AND METHODS FOR CONTROLLING POWER CONVERTERS

(71) Applicant: Hamilton Sundstrand Corporation, Charlotte, NC (US)

(72) Inventor: David S. Hoyt, Waltham, MA (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 14/699,212

(22) Filed: Apr. 29, 2015

(51) Int. Cl.
  *H02M 3/158* (2006.01)
  *H02H 9/04* (2006.01)
  *H03F 1/52* (2006.01)

(52) U.S. Cl.
  CPC ............... *H02M 3/158* (2013.01); *H02H 9/04* (2013.01); *H03F 1/52* (2013.01)

(58) Field of Classification Search
  CPC .......... H02M 3/158; H02H 9/04; G05F 1/40; H03F 1/52
  See application file for complete search history.

(56) References Cited

U.S. PATENT DOCUMENTS

| 7,254,000 B1* | 8/2007 | Smith | H02H 7/1213 323/224 |
| 2002/0130645 A1* | 9/2002 | Tsai | G05F 1/24 323/274 |
| 2004/0090218 A1* | 5/2004 | Isham | H02M 3/1588 323/282 |
| 2011/0080156 A1* | 4/2011 | Briere | H02M 1/32 323/351 |
| 2015/0145497 A1* | 5/2015 | Torres | H02M 3/158 323/283 |

* cited by examiner

*Primary Examiner* — Jessica Han
*Assistant Examiner* — Bart Iliya
(74) *Attorney, Agent, or Firm* — Locke Lord LLP; Scott D. Wofsy; Christopher J. Cillié

(57) ABSTRACT

A non-isolated (transformerless) direct current-to-direct current (DC-DC) power supply includes a voltage converter module that converts DC input voltage having a first voltage level into a DC output having a second voltage level that is less than the first voltage level. An overvoltage protection module interposed between the input voltage source and the input to the DC-DC converter monitors the DC output and removes power from the voltage converter module if the DC output exceeds an overvoltage threshold. A second level of overvoltage protection that responds faster than the power disconnect module is provided within the DC-DC converter PWM controller, providing additional overvoltage protection to the DC-DC converter and preventing application of the input voltage to the converter output.

10 Claims, 3 Drawing Sheets

SYSTEMS AND METHODS FOR CONTROLLING POWER CONVERTERS

GOVERNMENT LICENSE RIGHTS STATEMENT

This invention was made with government support under Contract No. FA8650-09-D-2923 awarded by the Air Force. The government has certain rights in the invention.

BACKGROUND OF THE INVENTION

1. Field of the Invention

The present disclosure relates to direct current-to-direct current (DC-DC) voltage converters, and more particularly to overvoltage protection for non-isolated (transformerless) DC-DC voltage converters.

2. Description of Related Art

For many years, aircraft electrical equipment incorporated a centralized power supply consisting of a multi-output, transformer isolated DC-DC converter to meet system load requirements. As processing systems have become more complex, requiring multiple low voltage rails with increased current capability and power sequencing, the power supply has trended towards a distributed power architecture. Generally, distributed power architectures include a single output, transformer isolated DC-DC converter with a distribution bus powering a series of point-of-load (POL) regulators. The POL regulators are generally efficient, provide tight regulation, reduced ripple and noise, and improved transient response while the transformer provides input/output ground isolation as well as fault isolation. In the event of a shorted switching element, the transformer typically isolates the input voltage to the converter from the output preventing fault propagation to the load. In systems not requiring input/output ground isolation, the transformer isolated DC-DC converter can be replaced with a non-isolated regulator to reduce cost, board area, and complexity. Certification requirements for such devices may include reducing the risk that a shorted pass element could cause the input voltage to be directly to the device output. The present disclosure provides a solution for this concern.

SUMMARY OF THE INVENTION

A robust, fast responding method of overvoltage protection capable of protecting the load in the event of a single point failure in which the input voltage is directly applied to the output (e.g., shorted pass element 114) is illustrated in FIG. 1. This method incorporates a dual (2-stage) protection scheme having a first stage 105 and a second stage 110 that limits the peak voltage applied to the load and limits the current and applied stresses during the fault.

First stage 105 includes an overvoltage comparator circuit 130 and a current limited "power disconnect" MOSFET 132 that removes input power from downstream synchronous buck regulators. Overvoltage comparator circuit 130 has an overvoltage threshold that is set below an overvoltage level sensed by synchronous buck regulator controller 120. AC hysteresis holds overvoltage comparator circuit 130 and power disconnect MOSFET 132 in an off-state for a duration of time that exceeds the duration of the sensed overvoltage fault to establish a low duty cycle hic-up mode rep-rate to minimize power dissipation and prevent overstress of the associated components, and to allow automatic recovery upon the removal of the fault.

Second stage 110 uses the fast responding overvoltage protection of synchronous buck regulator controller 120. When the output voltage rises a defined percentage above its regulation point (typically 10%), the synchronous buck regulator controller 120 immediately turns OFF a top (magnetizing) MOSFET 114 and turns ON a bottom (synchronous) MOSFET 116, crowbarring the voltage output applied output lead 104. This circuit limits the peak output voltage at load 12 and quickly discharges the capacitance associated with output filter 112. To protect the bottom (synchronous) MOSFET 116 in the event of a shorted top (magnetizing) MOSFET 114, the current limiting provided by the power disconnect MOSFET 132 is sized to keep the bottom (synchronous) MOSFET 116 within its safe operating area curve.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
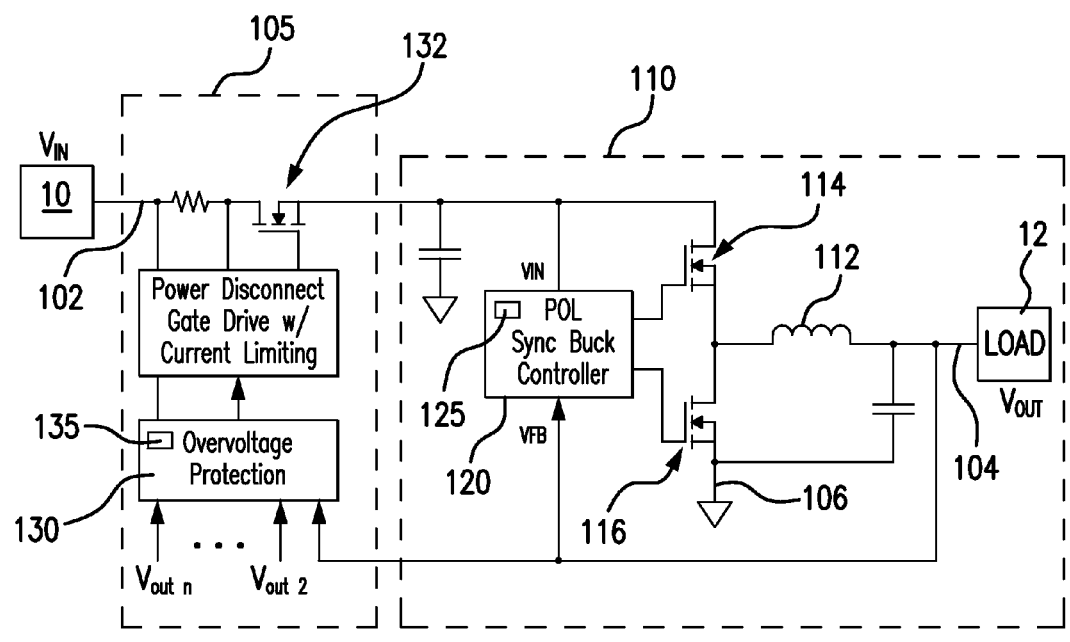
FIG. 1 is a circuit diagram of an exemplary embodiment of a direct current-to-direct current (DC-DC) power converter constructed in accordance with the present disclosure, showing a power converter module, an external overvoltage module (i.e. a first stage), and an internal overvoltage module (i.e. a second stage)

Reference will now be made to the drawings wherein like reference numerals identify similar structural features or aspects of the subject disclosure. For purposes of explanation and illustration, and not limitation, a partial view of an exemplary embodiment of a power converter in accordance with the disclosure is shown in FIG. 1 and is designated generally by reference character 100. Other embodiments of power converters and methods of overvoltage protection in accordance with the disclosure, or aspects thereof, are provided in FIGS. 2-3, as will be described. The systems and methods described herein can be used in non-isolated (i.e. transformerless) direct current-to-direct current (DC-DC) power converters, such as for supplying power to electrical components within an aircraft engine FADEC.

As used herein, the term module refers to one or more of a hardware module including an application specific integrated circuit, an electronic circuit, a processor (shared, dedicated, or group), and memory that execute one or more software or firmware programs, a combinational logic circuit, and/or other suitable components that provide the described functionality. In at least one embodiment of the present disclosure, a module may include a microcontroller as understood by those ordinarily skilled in the art.

With reference to FIG. 1, a power converter is generally indicated with reference numeral 100. Power converter 100 includes a power converter module 110 with an internal overvoltage detection module 125 housed within a POL synchronous buck controller 120 and an external overvoltage detection module 105. Power converter module 110 is connected between an input lead 102 and an output lead 104. A voltage source 10 (e.g., +28V DC aircraft power bus) is connected to input lead 102 (e.g., input lead to aircraft engine controller such as a FADEC) and a load 12 (e.g., an output rail within FADEC that can power multiple digital electronic components) is connected to output lead 104. In the illustrated exemplary embodiment, power converter 100 includes a DC-DC power supply with a non-isolated transformerless architecture configured to convert input DC voltage received on input lead 102 into a lower output DC voltage applied to output lead 104.

Power converter module 110 includes an output filter 112, a magnetizing (series pass) MOSFET 114, a bottom synchronous MOSFET 116, and a synchronous buck controller 120. Synchronous buck controller 120 includes an internal overvoltage protection module. In addition to the operations described below, synchronous buck controller 120 senses an overvoltage applied to output lead 104 and immediately opens top magnetizing MOSFET 114 and closes bottom synchronous MOSFET, crowbarring the output.

Top magnetizing MOSFET 114 is connected in series between output filter 112 and input lead 102. Top magnetizing MOSFET 114 is also connected to a ground lead 106 through bottom synchronous MOSFET 116. In this respect synchronous buck controller module 120 is electrically communicative with output lead 104 and operably associated with both Top magnetizing MOSFET 114 and bottom synchronous MOSFET 116 for complementary tandem opening and closing of both switches. As will be appreciated, this enables conversion of input DC voltage into a lower output DC voltage using output filter 112. As will also be appreciated, it is also desirable to prevent both shoot-through (closure of both top magnetizing MOSFET 114 and bottom synchronous MOSFET 116 at the same time) and application of voltages to output lead 104 that exceed the voltage rating of load 12.

External overvoltage protection module 130 is electrically communicative with output lead 104 through an output voltage monitoring lead and is operatively associated with a power disconnect MOSFET 132 through a command signal lead. In the illustrated exemplary embodiment, external overvoltage detection module 130 includes an overvoltage comparator circuit 135 that determines the overvoltage condition based on the comparison of the output voltage and a reference voltage that establishes an overvoltage threshold. When the output voltage exceeds the threshold voltage, the overvoltage detection module generates an overvoltage shutdown command signal. Internal overvoltage module 125 and external overvoltage module 130 cooperate to prevent application of voltages exceeding the rating of load 12 output lead 104. In this respect, internal overvoltage module 125 and external overvoltage module 130 establish a dual (2-stage) overvoltage protection scheme. External overvoltage module 130 includes overvoltage comparator circuit 135 and current limited "power disconnect" MOSFET 132 that removes input power from the downstream synchronous buck regulators. An overvoltage threshold of overvoltage comparator circuit 135 is below an overvoltage level sensed by internal overvoltage module 125 within POL synchronous buck controller 120. AC hysteresis holds the comparator and MOSFET switch in the off-state for a duration of time that exceeds the duration of the sensed overvoltage fault to establish a low duty cycle hic-up mode rep-rate to minimize power dissipation and prevent overstress of the associated components, and to allow automatic recovery upon the removal of the fault.

The second stage (internal overvoltage module 125) uses the fast responding overvoltage protection feature available within many synchronous buck regulator controllers. When the output voltage rises a defined percentage above its regulation point (in embodiments about 10%), the controller immediately turns OFF the top magnetizing MOSFET 114 and turns ON the bottom synchronous MOSFET 116, crowbarring the output. This circuit limits the peak output voltage at the load and quickly discharges the output filter capacitance of output filter 112. To protect the bottom synchronous MOSFET 116 in the event that top magnetizing MOSFET 114 is shorted, the current limiting provided by the power disconnect MOSFET 132 is sized to keep the bottom synchronous MOSFET 116 within its safe operating area (SOA) curve.

Figure 2:
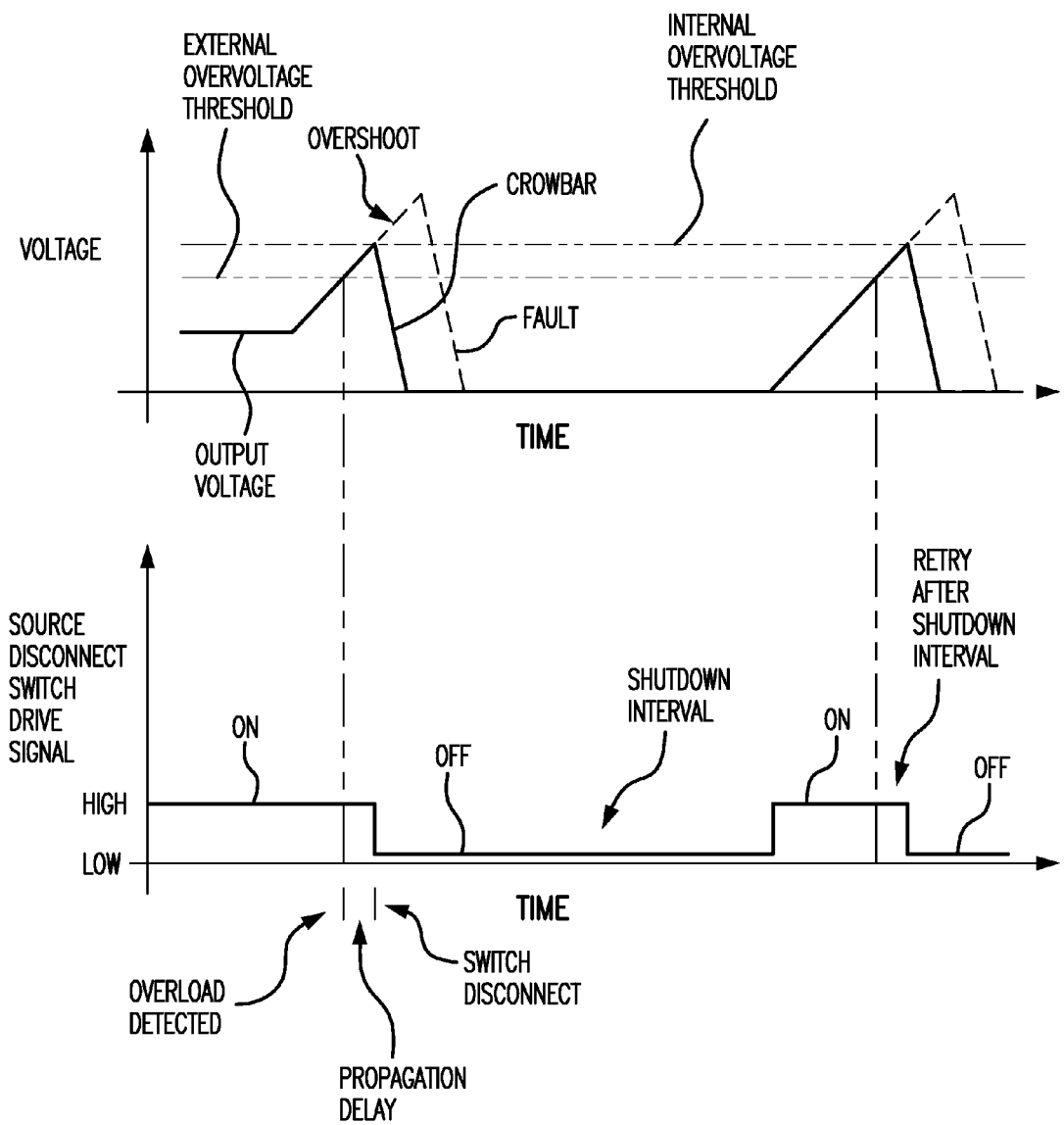
FIG. 2 is a graph of the output voltage of the power converter module of FIG. 1, showing the output voltage response during an overvoltage fault, with respect to the first and second overvoltage thresholds, and the shutdown command signal applied to the power disconnect MOSFET of the external overvoltage module.

With reference to FIG. 2, a chart A showing output voltage, overvoltage thresholds, and the overvoltage switch command signal is shown. In the illustrated exemplary embodiment, a first overvoltage threshold (i) is greater than the regulation voltage output target (ii) of 100% and is less than a second overvoltage threshold (iii) of 110%. External overvoltage module (shown in FIG. 1) applies a command signal to power disconnect MOSFET 132 (shown in FIG. 1). As the overvoltage continues to rise due to propagation delays in turning off the power disconnect MOSFET, the internal overvoltage module 125 (shown in FIG. 1) senses when the voltage reaches the second overvoltage threshold and immediately opens top magnetizing MOSFET 114 (shown in FIG. 1) and closes bottom synchronous MOSFET 116 (shown in FIG. 1), crowbarring the output The power disconnect MOSFET together with external overvoltage protection module 130 protect the synchronous MOSFET Q116 by limiting the current. This cooperation prevents the output DC voltage applied to output lead 104 from exceeding the second overvoltage threshold, holding the overvoltage to less than or equal to 10% above the output voltage target during the event for illustrated exemplary embodiment.

With continuing reference to FIG. 1, each of power disconnect MOSFET 132, Top magnetizing MOSFET 114 and bottom synchronous MOSFET 116 include solid-state switching devices. Current limiting using power disconnect MOSFET 132 as described above can protect the low side (bottom synchronous MOSFET 116), and may also be controlled to provide hysteresis for a low duty cycle hiccup mode operation with automatic recovery upon the removal of cause of a given overvoltage event.

Figure 3:
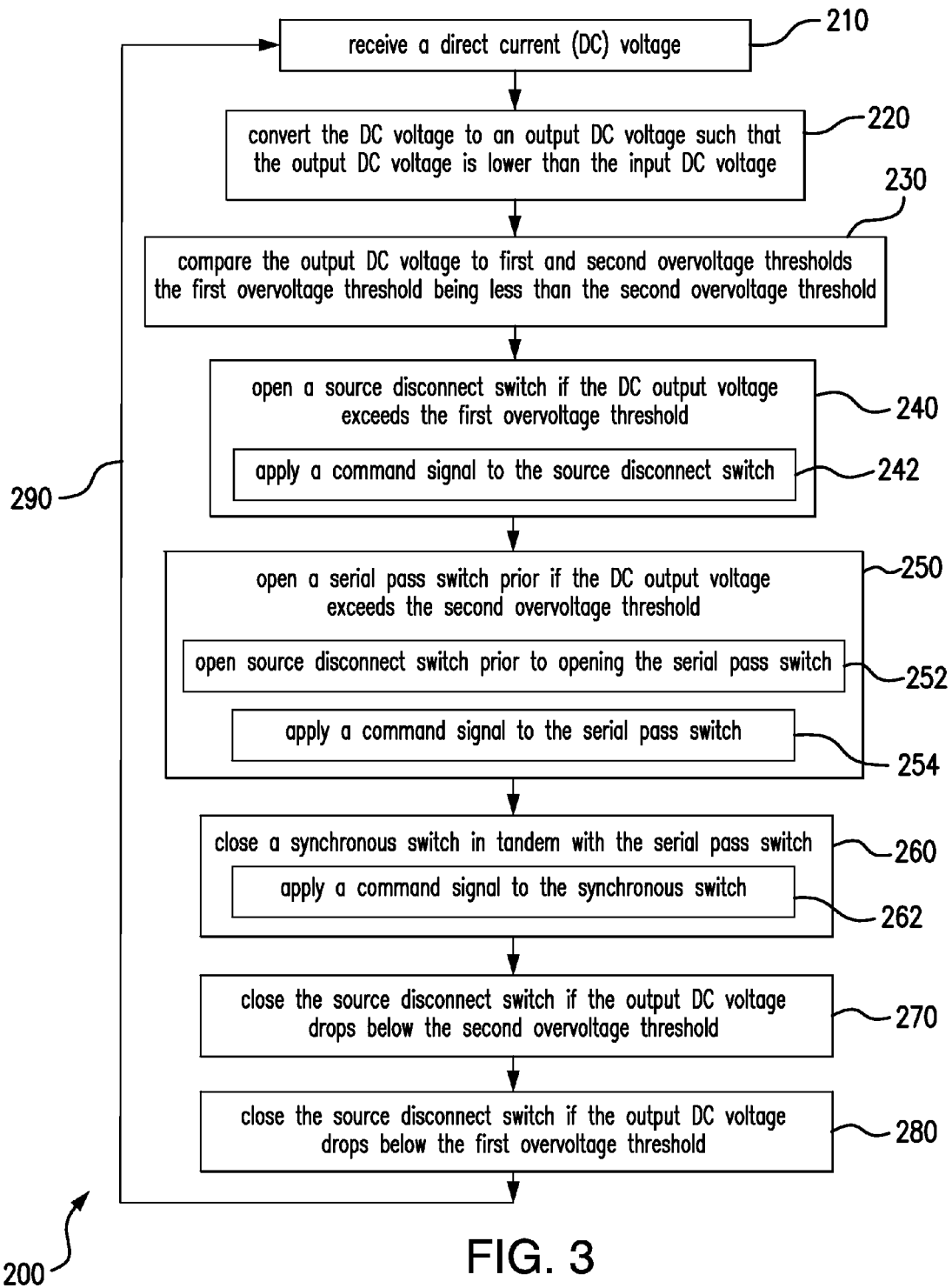
FIG. 3 shows a method for controlling the DC-DC power converter and implementing the 2-stage overvoltage protection scheme of FIG. 1, according to an embodiment.

With reference to FIG. 3, a method 200 of providing a dual (2-stage), fast responding overvoltage protection scheme for power converter 100 is shown. Method 200 includes receiving an input DC voltage as shown with box 210. The received DC voltage is converted to an output DC voltage, as shown with box 220. The output DC voltage is compared to first and second overvoltage thresholds, as shown with box 230, where the first overvoltage threshold is less than the second overvoltage threshold, e.g. using internal overvoltage module 125 and external overvoltage protection module 130. If the output DC voltage is greater than the first overvoltage threshold, the external overvoltage module applies an overvoltage shutdown command signal to open a power disconnect MOSFET, e.g. power disconnect MOSFET 132, shown with box 240.

If propagation delays in opening power disconnect MOSFET 132 allow the output voltage to rise to the second overvoltage threshold, internal overvoltage module 125 immediately opens top magnetizing MOSFET 114 and closes the bottom synchronous MOSFET 116, crowbarring the output. This circuit limits the peak output voltage at the load and quickly discharges the output filter capacitance of output filter 112. In the event that top magnetizing MOSFET 114 is shorted, current limiting is provided by power disconnect MOSFET 132 such that bottom synchronous MOSFET 116 remains within its SOA curve. External overvoltage module 130 incorporates AC hysteresis that holds the overvoltage comparator circuit 135 and power disconnect MOSFET 132 in the off-state for a duration of time that exceeds the duration of the sensed overvoltage fault to establish a low duty cycle hic-up mode rep-rate to minimize power dissipation and prevent overstress of the associated components, and to allow automatic recovery upon the removal of the fault. Method 200 may be iteratively implemented, such as a component of an output voltage monitoring scheme, as indicated with arrow 290.

Distributed power architectures that do not require input/output ground isolation often incorporate a non-isolated buck converter that converts a DC input voltage (e.g., a +28 volt DC airframe bus) to a lower DC output voltage as required by the load (e.g. a 5 volt supply voltage for powering digital components). The input voltage is connected to a low pass L-C filter through a pulse-width modulated (PWM) MOSFET that averages the switching voltage to a relatively constant DC output voltage. A synchronous MOSFET switch connected from ground to the input side of the L-C filter operates complimentary (minus a small dead time to prevent both MOSFETs from being ON simultaneously) to the upper MOSFET switch, clamping the switch node to just below ground and allowing the inductor current to decay such that the net average current remains constant. The MOSFET switches are controlled by a PWM controller to regulate the DC output voltage. One major concern with this implementation is that a single point failure, i.e. series MOSFET switch connecting the input voltage to the LC filter, can result in the input voltage being applied directly to the output, potentially damaging critical loads A robust, fast responding method of overvoltage protection incorporates a dual (2-stage) protection scheme that limits the peak voltage applied to the load and limits the current and applied stresses during the fault.

An external voltage protection module can provide overvoltage protection for the load. The external voltage protection module may include a controller and a power disconnect MOSFET interposed between the voltage source lead and the power converter input lead. The controller is electrically communicative with the filter output lead and operative associated with the power disconnect MOSFET such that, when the voltage applied to the filter output lead exceeds an external protection module threshold, the external voltage protection module disconnects the power converter from the voltage source lead by opening the power disconnect MOSFET.

In embodiments described herein the external protection module threshold is unequal to the internal protection module threshold. In certain embodiments, the external voltage protection module has an overvoltage threshold that is less than the overvoltage threshold of the internal protection module. For example, in one contemplated embodiment, the internal voltage protection module has an overvoltage threshold of 110%, and the external voltage protection module has an overvoltage threshold of less than 110%. Improving responsiveness to overvoltage events makes it less likely that the output load (i.e. electrical components) will be subjected to voltages in excess of the voltage rating of the loads (i.e. electrical components will be applied to the power converter output lead). In power distribution systems with loads sensitive to overvoltage, this potentially improves reliability. In some DC-DC power converters, the improved responsiveness provided by the external overvoltage module can remove a single point of failure risk potentially posed by the top magnetizing MOSFET.

The methods and systems of the present disclosure, as described above and shown in the drawings, provide for robust, fast responding overvoltage protection of non-isolated (i.e. transformerless) synchronous buck regulators. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of controlling a power converter, comprising:
   receiving a direct current (DC) voltage;
   converting the DC voltage to an output DC voltage, wherein the output DC voltage is lower than the input DC voltage;
   comparing the output DC voltage to first and second overvoltage thresholds, the first overvoltage threshold being less than the second overvoltage threshold;
   opening a power disconnect MOSFET if the DC output voltage exceeds the first overvoltage threshold; and
   opening a top magnetizing MOSFET if the DC output voltage exceeds the second overvoltage threshold.

2. A method as recited in claim 1, further including closing a bottom synchronous MOSFET in tandem with opening the top magnetizing MOSFET.

3. A method as recited in claim 1, further including opening the top magnetizing MOSFET in tandem with closing the bottom synchronous MOSFET to crowbar the DC output voltage.

4. A method as recited in claim 1, further including applying a command signal to the power disconnect MOSFET prior to opening the top magnetizing MOSFET and closing the bottom synchronous MOSFETs.

5. A method as recited in claim 1, wherein the first and second overvoltage thresholds are greater than an output voltage target of the power converter.

6. A method as recited in claim 1, wherein the first overvoltage threshold greater than an output voltage target of the power converter and less than 110% of the target.

7. A method as recited in claim 1, wherein the second voltage threshold is greater than 110% of an output voltage target of the power converter.

8. A method as recited in claim 1, further including closing the power disconnect MOSFET if the output DC voltage drops below the first overvoltage threshold.

9. A power converter, comprising:
   an inductor connected to an input lead and an output lead, wherein the inductor is configured to receive a first direct current (DC) voltage level through input lead and apply a lower output DC voltage to the output lead;
   an internal overvoltage detection module electrically communicative with the output lead and operatively associated with a top magnetizing MOSFET, wherein top magnetizing MOSFET is connected to the input lead; and an external overvoltage detection module electrically communicative with the output lead and operatively associated with a power disconnect MOSFET, wherein the power disconnect MOSFET is connected in series with the top magnetizing MOSFET, wherein the external over-voltage detection module has a first overvoltage protection threshold that is less than a second overvoltage protection threshold of the internal over-voltage detection module to disconnect the top magnetizing MOSFET from a voltage source prior to a DC voltage in excess of the second voltage threshold being applied to the output lead.

10. A power converter as recited in claim 9, further including a FADEC connected to the output lead.

* * * * *